(12) United States Patent  (10) Patent No.: US 7,767,490 B2
Park et al.  (45) Date of Patent: Aug. 3, 2010

(54) ORGANIC LIGHT EMITTING DEVICE AND METHOD OF FABRICATING THE SAME

(75) Inventors: Jaeyong Park, Anyang-si (KR); Wonhee Choi, Seoul (KR); Byoungjune Lee, Kimcheon-si (KR); Donghwan Kim, Dalseo-gu (KR); Hyungchul Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/265,577

(22) Filed: Nov. 5, 2008

(65) Prior Publication Data
US 2009/0127545 A1 May 21, 2009

(30) Foreign Application Priority Data
Nov. 6, 2007 (KR) .................. 10-2007-0112901

(51) Int. Cl.
*H01L 51/40* (2006.01)
(52) U.S. Cl. .................. 438/99; 438/149; 438/23; 438/33; 257/E51.019; 257/40
(58) Field of Classification Search .................. 257/98, 257/642–643, 759, E39.007, E51.001–E51.052, 257/E27.117–E27.119; 438/99, 149, 23
See application file for complete search history.

(56) References Cited

U.S. PATENT DOCUMENTS 7,408,192 B2 * 8/2008 Kang .................. 257/59

2005/0070039 A1 * 3/2005 Yamazaki et al. .................. 438/33
2007/0278480 A1 * 12/2007 Hwang et al. .................. 257/40
2008/0067932 A1 * 3/2008 Baek et al. .................. 313/509

FOREIGN PATENT DOCUMENTS

CN 1643657 A 7/2005
CN 1905207 A 1/2007

* cited by examiner

*Primary Examiner*—Fernando L Toledo
*Assistant Examiner*—Mamadou Diallo
(74) *Attorney, Agent, or Firm*—Birch, Stewart, Kolasch & Birch, LLP

(57) ABSTRACT

An organic light emitting device and a method for fabricating the same are discussed. According to an embodiment, the method includes forming a mother substrate structure including organic light emitting devices including TFTs and first electrodes, each first electrode electrically connected to the corresponding TFT and being a part of an OLED to be formed; forming first and second conductive layers to form a power line in each organic light emitting device; forming a dummy layer on the first electrodes and the second conductive layer; performing at least one of scribing and grinding processes on the mother substrate structure to divide the mother substrate structure into sub-substrate structures; removing the dummy layer from the first electrodes and the second conductive layer after the performing step; and forming a light emitting layer and a second electrode on the first electrode in one of the sub-substrate structures to form the OLED.

9 Claims, 8 Drawing Sheets

ORGANIC LIGHT EMITTING DEVICE AND METHOD OF FABRICATING THE SAME

This application claims the priority benefit of Korean Patent Application No. 10-2007-0112901 filed on Nov. 6, 2007 in Republic of Korea, which is incorporated herein by reference for all purposes as if fully set forth herein.

BACKGROUND OF THE INVENTION

1. Field of the Invention

An exemplary embodiment relates to an organic light emitting device and a method of fabricating the same.

2. Discussion of the Related Art

Recently, flat panel display devices such as a liquid crystal display, an organic light emitting device, and a plasma display panel have been receiving much attention because the flat panel display devices can solve defects of a related art display device such as a cathode ray tube.

In particular, because the organic light emitting device has a self-emitting structure that emits light without a light source such as a backlight unit, the organic light emitting device can be fabricated through a simple process to be light and thin. The organic light emitting device has been considered as the next generation display device due to characteristics such as a low drive voltage, a high emitting efficiency, and a wide viewing angle.

The organic light emitting device is fabricated by attaching an organic light emitting element array substrate provided with a plurality of organic light emitting elements to an encapsulation substrate for enclosing the organic light emitting element array substrate, scribing the attached structure along one or more organic light emitting elements, and performing a module process.

The organic light emitting element array substrate may be fabricated through the following process. Because the fabrication process is widely known in the related art, the fabrication process is described briefly.

A thin film transistor is formed on each subfield of a substrate. The thin film transistor may include a semiconductor layer, a gate insulating layer, a gate electrode, an interlayer dielectric layer, a source electrode, and a drain electrode.

A protective layer is formed on the thin film transistor, and then a first electrode is formed on the protective layer to be electrically connected to the drain electrode of the thin film transistor by passing through the protective layer. Hence, a thin film transistor array substrate including the thin film transistors and the corresponding first electrodes is formed.

Next, the thin film transistor array substrate is scribed to be separated into a plurality of substrate structures. Then an organic light emitting diode including an organic light emitting layer and a second electrode is fabricated on the first electrode, and the organic light emitting element array substrate is attached to the encapsulation substrate. Next, the attached structure is scribed, and then the module process is performed to fabricate the individual organic light emitting devices.

As described above, before the organic light emitting layer is formed on the first electrodes, the mother substrate having the thin film transistors and the first electrodes is scribed, for the convenience of fabrication process, to be separated into the plurality of substrate structures, each having a desired size. Next, these substrate structures go through a grinding process. However, a foreign material such as glass chips or particles is generated during the scribing process or the grinding process, and gets attached to the surface of the first electrodes and the surface of a power line provided in the substrate structures. The attached foreign materials may reduce electrical characteristics of the first electrodes, and/or form poor organic light emitting layers in a succeeding formation process for the organic light emitting layers. For instance, black spots may be generated in the organic light emitting device, the surface of the power line may be polluted, and resistance characteristics may be changed to be undesirable.

SUMMARY OF THE INVENTION

Accordingly, an exemplary embodiment of the present invention provides an organic light emitting device and a method of fabricating the same capable of improving the fabrication yield, the light emitting efficiency, and the reliability by preventing a first electrode and/or a power line from being polluted by a foreign material generated during scribing and/or grinding processes.

Additional features and advantages of the exemplary embodiments of the invention will be set forth in the description which follows, and in part will be apparent from the description, or may be learned by practice of the exemplary embodiments of the invention. The objectives and other advantages of the exemplary embodiments of the invention will be realized and attained by the structure particularly pointed out in the written description and claims hereof as well as the appended drawings.

According to an embodiment, the present invention provides a method for fabricating an organic light emitting device, comprising: forming a mother substrate structure including a plurality of organic light emitting devices, each of the organic light emitting devices including a plurality of thin film transistors and a plurality of first electrodes, each of the first electrodes being electrically connected to the corresponding thin film transistor and being a part of an organic light emitting diode (OLED) to be formed; forming a first conductive layer on an insulating layer, and a second conductive layer on the first conductive layer, so as to form a power line in each of the organic light emitting devices; forming a dummy layer on the first electrodes and the second conductive layer; performing at least one of a scribing process and a grinding process on the mother substrate structure including the dummy layer so as to divide the mother substrate structure into a plurality of sub-substrate structures; removing the dummy layer from the first electrodes and the second conductive layer after the performing step; and forming a light emitting layer and a second electrode on the first electrode in at least one of the sub-substrate structures so as to form the OLED.

According to another embodiment, the present invention provides an organic light emitting device, comprising: a thin film transistor including a gate electrode, a source electrode and a drain electrode over a substrate; an organic light emitting diode including a first electrode and a second electrode, and being electrically connected to the drain electrode of the thin film transistor; and a power line including a first conductive layer on an insulating layer, and a second conductive layer on the first conductive layer, wherein the second conductive layer and the first electrode are formed using a same material.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 3 to 8 illustrate different stages in a method of fabricating the organic light emitting device according to an embodiment of the present invention, wherein FIGS. 3-6 and 8 illustrate cross-sectional views of portions of the organic light emitting device and FIG. 7 illustrates plane views of portions of the organic light emitting device.

DETAILED DESCRIPTION OF THE ILLUSTRATED EMBODIMENTS

Reference will now be made in detail embodiments of the invention examples of which are illustrated in the accompanying drawings.

Figure 1A:
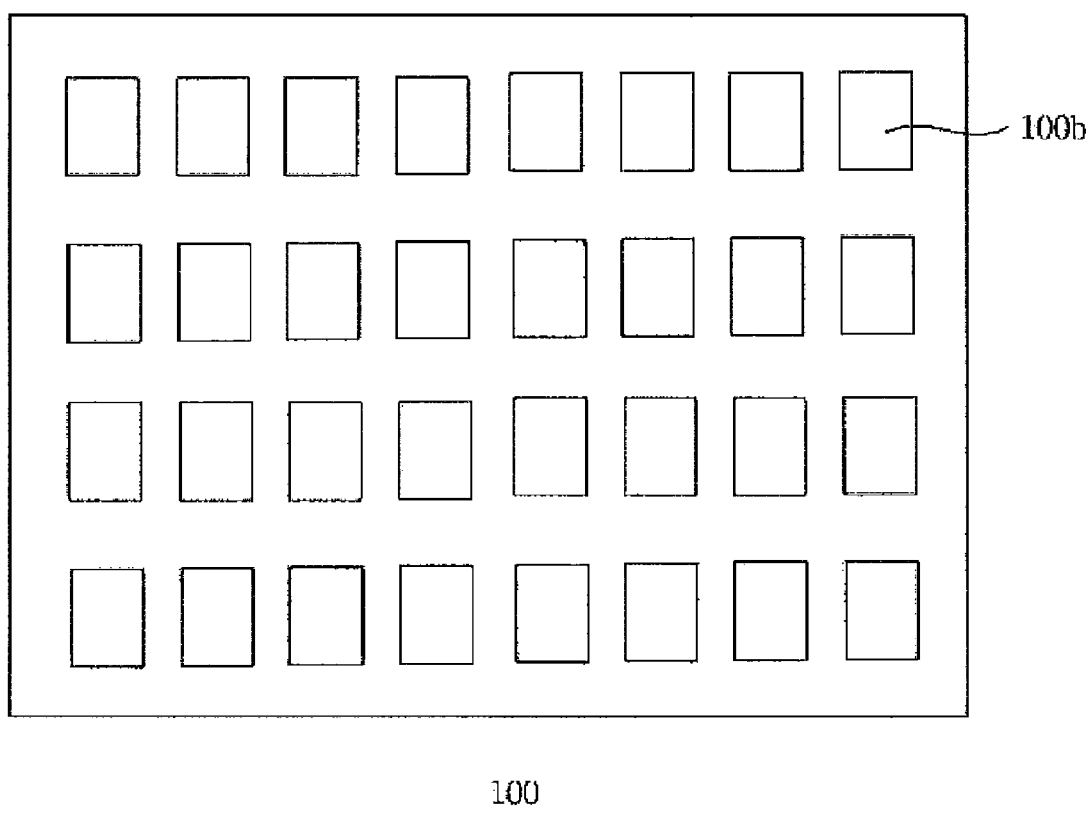
FIGS. 1A and 1B are plane views of an organic light emitting device according to an exemplary embodiment of the present invention.
Figure 1B:
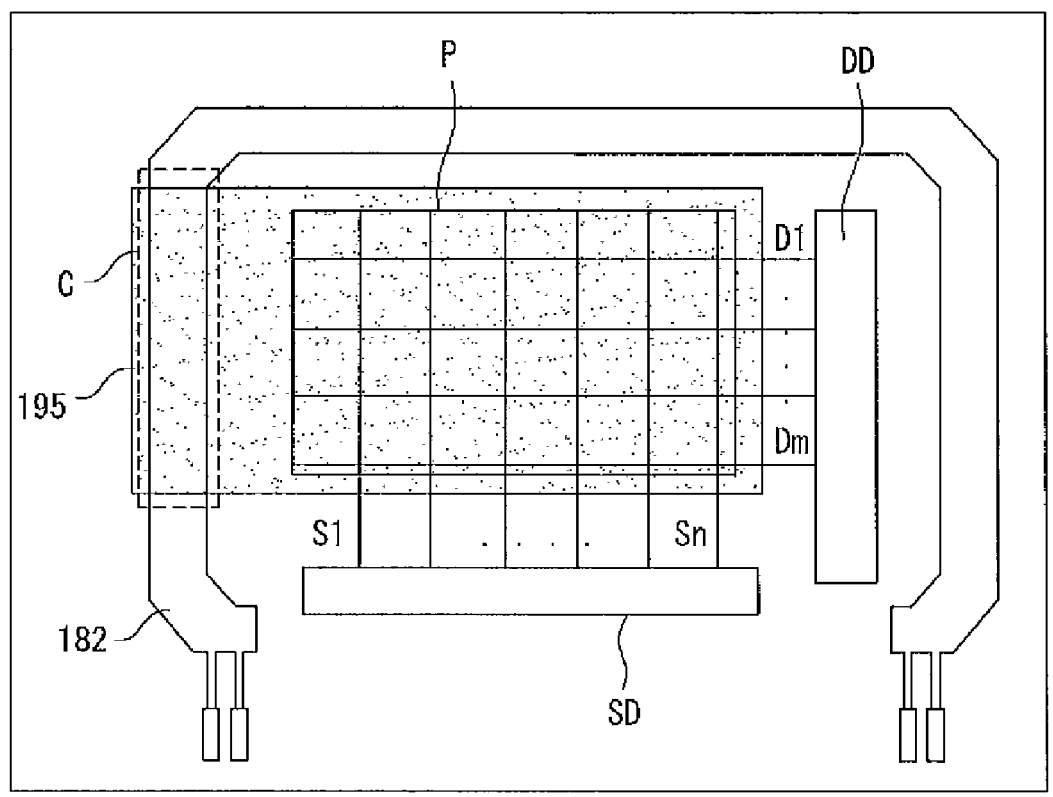

FIGS. 1A and 1B are plane views of an organic light emitting device according to an embodiment of the present invention.

As shown in FIG. 1A, a plurality of organic light emitting devices 100b are formed on a mother substrate 100 to form an organic light emitting element array substrate. A reference numeral 100b indicates a unit for fabricating one organic light emitting device, and the organic light emitting device may include a plurality of sub-pixels each including a thin film transistor and an organic light emitting diode connected to the corresponding thin film transistor.

The mother substrate 100 is attached to an encapsulation substrate (not shown). The attached structure sequentially goes through a scribing process and a module process to fabricate individual organic light emitting devices 100b. An example of one such organic light emitting device 100b is shown in FIG. 1B.

As shown in FIG. 1B, the organic light emitting device 100b includes a display unit P, a scan driver SD, a data driver DD, and a power line 182. All components of the organic light emitting device 100b are operatively connected and configured.

The display unit P includes a plurality of sub-pixels defined by crossings of scan lines S1 to Sn and data lines D1 to Dm generally perpendicular to each other. Each sub-pixel receives an electrical signal from the scan driver SD and the data driver DD through the scan lines S1 to Sn and the data lines D1 to Dm.

Each of the sub-pixels in the display unit P includes a thin film transistor and an organic light emitting diode electrically connected to the corresponding thin film transistor. The organic light emitting diode preferably includes a first electrode, an organic light emitting layer, and a second electrode 195 corresponding to a common electrode. The sub-pixels are connected to the power line 182 though the second electrode 195 of the organic light emitting diode. The power line 182 may supply a negative voltage or a ground voltage to the second electrode 195, and the electric current generated in the organic light emitting diode flows out through the power line 182. Hence, the power line 182 may be formed in a wide area so as to surround the display unit P. Although the case where a portion of the power line 182 contacts the second electrode 195 is described and shown in the exemplary embodiment, the exemplary embodiment is not limited thereto and can encompass other examples. Hereinafter, an area where a portion of the power line 182 contacts the second electrode 195 is referred to herein as a second electrode contact portion C for the convenience of explanation.

The structure of the organic light emitting device according to the exemplary embodiment will be described below with reference to FIG. 2. The organic light emitting device shown in FIG. 2 is preferably the fabricated organic light emitting device 100b of FIG. 1B according to an embodiment.

Figure 2:
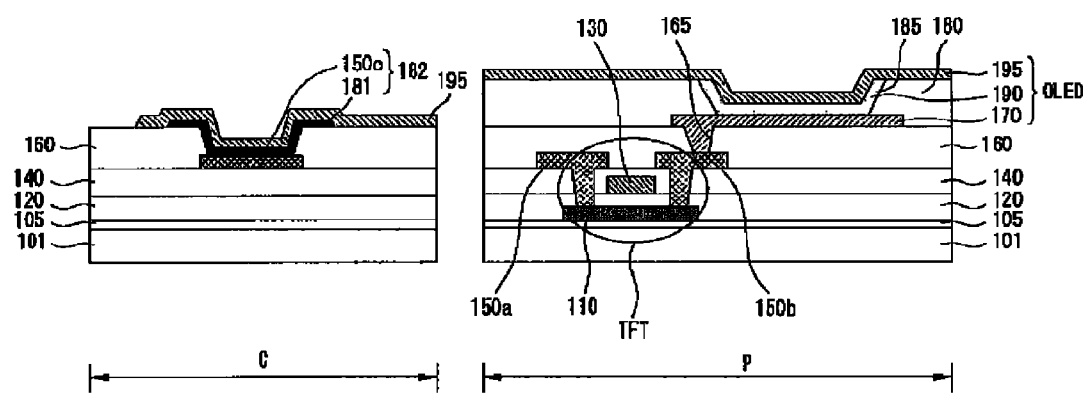
FIG. 2 illustrate cross-sectional views of portions of the organic light emitting device according to an embodiment of the present invention.

As shown in FIG. 2, a buffer layer 105 is positioned on a substrate 101, and a thin film transistor TFT is positioned on the buffer layer 105. The thin film transistor TFT may include a semiconductor layer 110, a first insulating layer 120 corresponding to a gate insulating layer, a gate electrode 130, a second insulating layer 140 corresponding to an interlayer dielectric layer, a source electrode 150a, and a drain electrode 150b.

A protective layer 160 is positioned on the thin film transistor TFT, and a first electrode 170 is positioned on the protective layer 160 to be connected to the drain electrode 150b through a contact hole 165. A bank layer 180 including an opening 185 is positioned on the first electrode 170, and the opening 185 exposes a portion of the first electrode 170.

An organic light emitting layer 190 is positioned on the first electrode 170 exposed by the opening 185, and a second electrode 195 is positioned on the organic light emitting layer 190. The first electrode 170, the organic light emitting layer 190, and the second electrode 195 constitute an organic light emitting diode OLED.

The first insulating layer 120 and the second insulating layer 140 are positioned on the buffer layer 105 in the second electrode contact portion C, and a first conductive layer 150c is positioned on the second insulating layer 140. The first conductive layer 150c may include the same formation material as the source electrode 150a and the drain electrode 150b, e.g., the first conductive layer 150c and the source and drain electrodes 150a and 150b may be formed with the same material and/or at the same time.

The protective layer 160 is positioned on the first conductive layer 150c, and a second conductive layer 181 is positioned on the protective layer 160 to be electrically connected to the first conductive layer 150c through the protective layer 160. The second conductive layer 181 may include the same formation material as the first electrode 170, e.g., the second conductive layer 181 and the first electrode 170 may be formed with the same material and/or at the same time. The first conductive layer 150c and the second conductive layer 181 constitute the power line 182.

The second electrode 195 is positioned on the power line 182. The power line 182 is electrically connected to the second electrode 195, and thus can supply a power to the second electrode 195.

Figure 5:
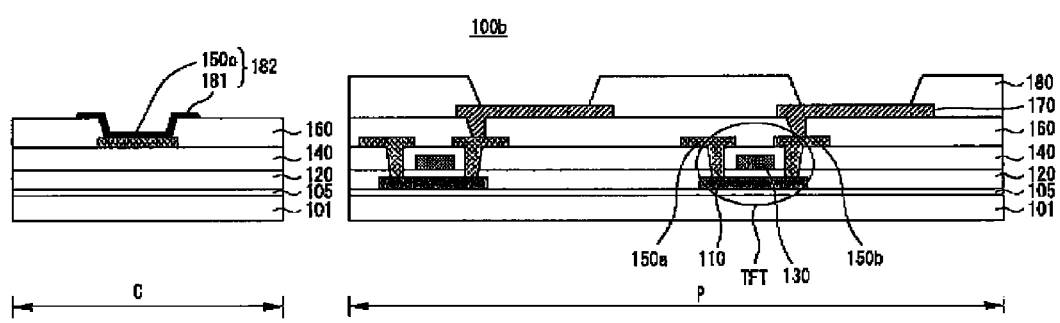
Figure 6:
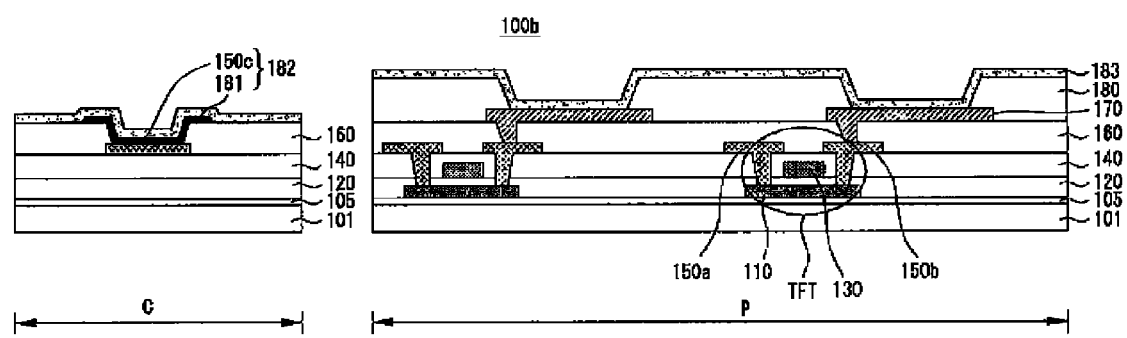
Figure 7:
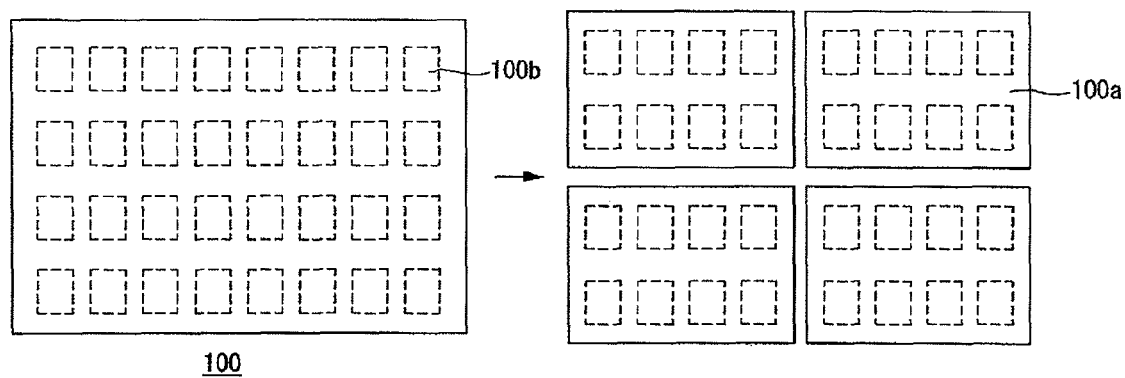

FIGS. 3 to 8 illustrate different stages in a method of fabricating an organic light emitting device according to an embodiment of the present invention. Particularly, FIGS. 3-6 and 8 illustrate cross-sectional views of portions of the organic light emitting device and FIG. 7 illustrates plane views of portions of the organic light emitting device. Preferably, the organic light emitting device of FIG. 2 is fabricated using the methods of FIGS. 3-8, but may be fabricated in other suitable method.

A plurality of organic light emitting elements may be formed on the mother substrate 100. Hereinafter, one organic light emitting element is regarded as a basic unit 100b for fabricating one organic light emitting device in the exemplary embodiment for the convenience of explanation. The structure of the second electrode contact portion C and the TFT area described in FIG. 2 will be described.

Figure 3:
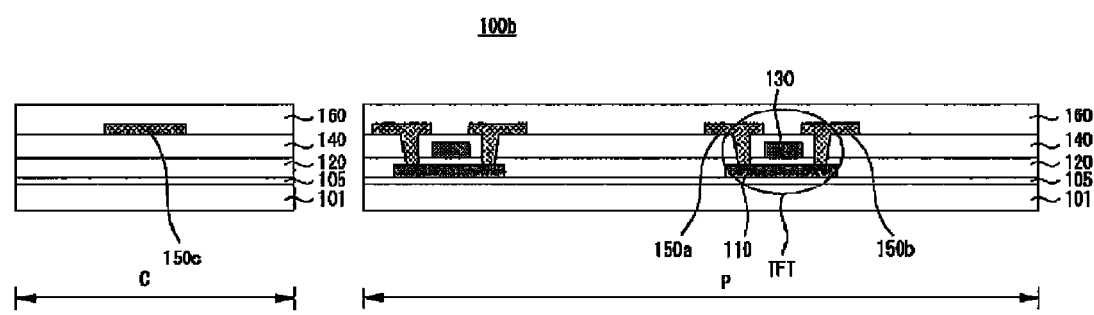

As shown in FIG. 3, the buffer layer 105 is formed on the substrate 101. The substrate 101 may include glass, plastic, or metal, and may be a flexible substrate. The buffer layer 105 prevents impurities discharged from the substrate 101 from being introduced during formation of the thin film transistor TFT in a succeeding process. The buffer layer 105 may be selectively formed.

The thin film transistor TFT is formed on the buffer layer 105. The thin film transistor TFT may include the semiconductor layer 110, the first insulating layer 120 corresponding to a gate insulating layer, the gate electrode 130, the second insulating layer 140 corresponding to an interlayer dielectric layer, the source electrode 150a, and the drain electrode 150b.

The first insulating layer 120 and the second insulating layer 140 are also positioned on the buffer layer 105 in the second electrode contact portion C, and the first conductive layer 150c is positioned on the second insulating layer 140. The first conductive layer 150c may be formed using the same formation material as the source electrode 150a and the drain electrode 150b through the same formation process as the source electrode 150a and the drain electrode 150b.

The source electrode 150a, the drain electrode 150b, and the first conductive layer 150c may include at least one of molybdenum (Mo), aluminum (Al), titanium (Ti), or an alloy thereof. The source electrode 150a and the drain electrode 150b may have a single-layered structure or a multi-layered stricture. For example, the source electrode 150a and the drain electrode 150b may have a triple-layered structure of Mo/Al/Mo.

A third insulating layer (protective layer) 160 is formed on the thin film transistor TFT and the first conductive layer 150c. The third insulating layer 160 may be a planarization insulating layer or a protective layer. The third insulating layer 160 may be formed of silicon oxide, silicon nitride, polyacrylate-based resin, or benzocyclobutene-based resin.

Figure 4:
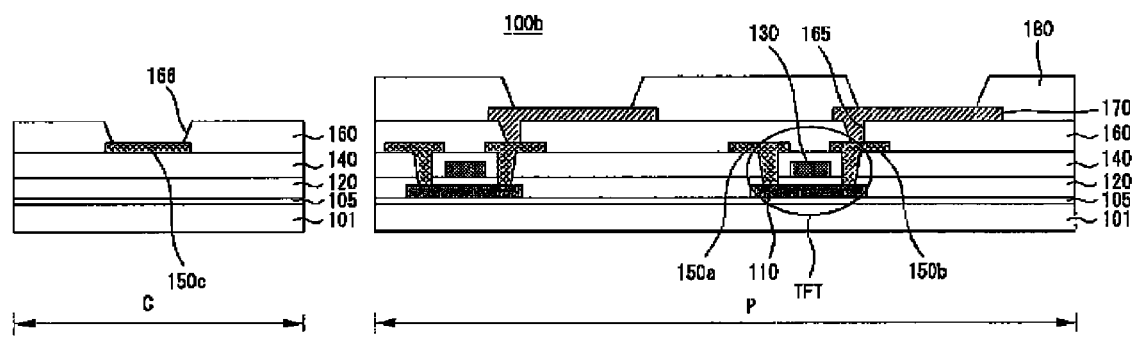

As shown in FIG. 4, a portion of the third insulating layer 160 is etched to form the contact hole 165 exposing a portion of the drain electrode 150b and a via hole 166 exposing a portion of the first conductive layer 150c. Next, the first electrode 170 is formed on the third insulating layer 160 to be electrically connected to the drain electrode 150b through the contact hole 165.

The first electrode 170 may be an anode electrode. The first electrode 170 may include a transparent conductive oxide layer such as indium-tin-oxide (ITO). The first electrode 170 may further include a reflective metal layer under the transparent conductive oxide layer.

The bank layer 180 is formed on the first electrode 170. The bank layer 180 provides insulation between the first electrodes 170. Next, a portion of the bank layer 180 is etched to form the opening 185 exposing a portion of the first electrode 170.

As shown in FIG. 5, the second conductive layer 181 is formed on the first conductive layer 150c. The second conductive layer 181 may be formed using a separate mask manufactured so as to expose only the second electrode contact portion C except the thin film transistor TFT and the first electrode 170. The second conductive layer 181 may include a conductive material such as ITO, copper, silver, platinum, and gold so as to prevent a damage of the first conductive layer 150c during a succeeding etching process of a dummy layer.

Although after the first electrode 170 and the bank layer 180 are formed, the second conductive layer 181 is formed in FIGS. 4 and 5, the second conductive layer 181 may be formed using the same formation material as the first electrode 170 through the same formation process as the first electrode 170. In that case, the method of fabricating the organic light emitting device can be simplified.

The first conductive layer 150c and the second conductive layer 181 can be electrically connected to the second electrode 195 of the organic light emitting diode in a succeeding process. Hereinafter, the first conductive layer 150c and the second conductive layer 181 are called the power line 182.

As shown in FIG. 6, a dummy layer 183 is formed on the mother substrate 100, on which the first electrode 170, the bank layer 180, and the power line 182 are formed. For example, the dummy layer 183 is formed on the first electrode 170, the bank layer 180, the protective layer 160 in the C area, and the second conductive layer 181. The dummy layer 183 may include a metal material such as molybdenum (Mo), a transparent conductive material such as ITO, indium-zinc-oxide (IZO), or ITZO, or an inorganic material such as silicon nitride.

When the mother substrate 100 is cut to be separated into a plurality of substrate structures each having a desired panel size during the succeeding scribing and/or grinding process, the dummy layer 183 prevents a foreign material, for example, a foreign material of glass chip or particle generated in the substrate structures from being attached to the first electrode 170.

Because the dummy layer 183 is formed for the purpose of protecting the first electrode 170, in another example, the dummy layer 183 may be formed on only the first electrode 170, e.g., the exposed potion of the first electrode 170. In other words, the dummy layer 183 may not be formed on the bank layer 180 and the power line 182.

Although it is not shown, one or more additional dummy layers may be formed oil the dummy layer 183. The additional dummy layer(s) may prevent a foreign material from being generated in the dummy layer 183 underlying the additional dummy layer during the scribing process.

The additional dummy layer(s) discussed above are optional layers, and thus do not have to be formed. In another example, the additional dummy layer may be selectively formed depending on a formation material of the dummy layer 183. The additional dummy layer may be formed of photoresist, polyacrylate-based resin, or benzocyclobutene-based resin.

As shown in FIG. 7, once the mother substrate 100 having the organic light emitting devices 100b thus fabricated as shown in FIGS. 3-6, the mother substrate 100 is scribed to be separated into a plurality of sub-substrates 100a. After the scribing process, edges of the plurality of sub-substrates 100a are grinded through a grinding process. For the convenience of fabrication process, the sub-substrate 100a may be the organic light emitting element array substrate for fabricating the plurality of organic light emitting devices 100b illustrated in FIG. 2. Otherwise, the sub-substrate 100a may be a basic unit for fabricating one organic light emitting device 100b. Through the scribing process and grinding process, the buffer layer 183 advantageously protects those layers formed therebelow (e.g., the first electrode 170) from being contaminated by any foreign material present or generated during the scribing and grinding processes.

Figure 8:
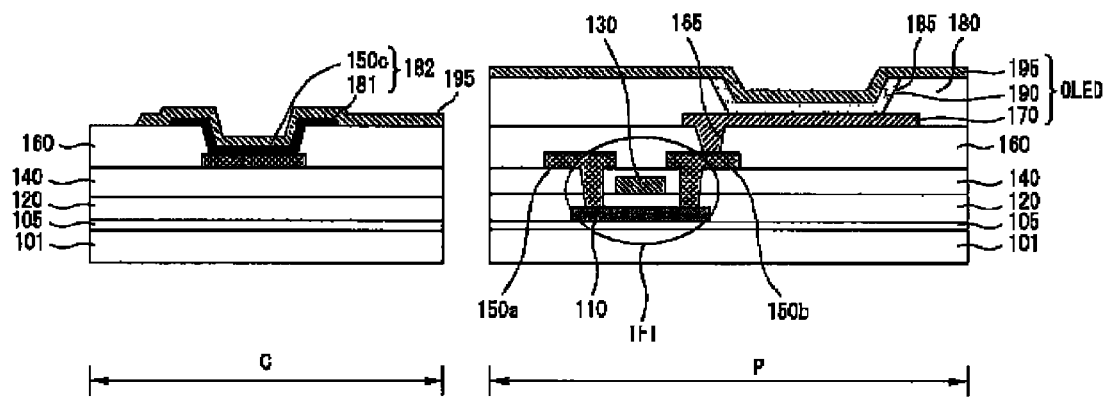

Thereafter, as shown in FIG. 8, the dummy layer 183 is removed from the sub-substrate 100a. For instance, the dummy layer 183 on the first electrode 170 and on any other layer is removed so that an organic light emitting layer can be formed on the first electrode 170.

The dummy layer 183 may be removed using a wet or dry etching process. For instance, in case the dummy layer 183 is formed of an inorganic insulating material like SiNx, SiOx etc, the dummy layer 183 may be removed using the dry etching process. In case the dummy layer 183 is formed of a metal material or a conductive material, the dummy layer 183 may be removed using the wet etching process. The removal of the dummy layer 183 can clean the surface of the first electrode 170.

For instance, in case the dummy layer 183 is formed of Mo, the dummy layer 183 is removed using the wet etching process and the surface of the first electrode 170 is partially removed and/or cleaned. Hence, because the surface roughness of the first electrode 170 may be reduced or smoothed out, the surface characteristics of the first electrode 170 can be considerably improved. Further, a work function of the first electrode 170 increases, the hole injection efficiency increases, and electrical characteristics of the organic light emitting device are improved.

When the dummy layer 183 is removed, the second conductive layer 181 of the power line 182 does not have to be damaged or removed. Because the power line 182 has to supply a constant negative power to the second electrode 195 of the organic light emitting diode, a line resistance has to be low and constant. Accordingly, the second conductive layer 181 has the conductivity so as to be electrically connected to the first conductive layer 150c. The second conductive layer 181 may be formed of a material having different etch selectivity from the dummy layer 183. For example, in case the source electrode 150a and the first conductive layer 150c are formed of Mo/Al/Mo, a Mo layer on the first conductive layer 150c is damaged during the wet etching process of the dummy layer 183 formed of Mo, and an Al layer under the first conductive layer 150c is exposed. Accordingly, because the surface characteristic of the power line 182 including the first conductive layer 150c changes, it is difficult to supply a constant power to the second electrode 195 in a succeeding process.

Accordingly, after the second conductive layer 181 is formed on the first conductive layer 150c using ITO, the dummy layer 183 is formed using Mo. As a result, because the second conductive layer 181 has etch selectivity in spite of the fact that the dummy layer 183 is removed using the wet etching process, the power line 182 is not damaged.

As shown in FIG. 8, the organic light emitting layer 190 is formed on the first electrode 170 exposed by the opening 185, and the second electrode 195 is formed on the organic light emitting layer 190 to form the organic light emitting diode OLED including the first electrode 170, the organic light emitting layer 190, and the second electrode 195. The second electrode 195 may be formed on the power line 182.

The second electrode 195 may be a cathode electrode and may be a common electrode. The second electrode 195 may be formed of a material having a low work function and excellent reflectivity such as Al, Mg and Ag, and may be formed of a transflective electrode.

The organic light emitting layer 190 receives holes from the first electrode 170 and receives electrons from the second electrode 195 to produce an exciton. An image is displayed by light emitted when the exciton returns to a ground level. Although it is not shown, hole injection and transport layers and electron injection and transport layers may be positioned between the organic light emitting layer 190 and the first electrode 170 and between the organic light emitting layer 190 and the second electrode 195.

As described above, in the above embodiments of the invention, before the mother substrate 100 is scribed, the dummy layer 183 is formed on the mother substrate 100. This prevents foreign materials, for example, a foreign material of glass chip or particle form discharged from the substrate during the scribing process and/or grinding process from being attached to the first electrode 170. Accordingly, the foreign materials generated during the scribing process and/or grinding are positioned on the dummy layer 183 and are together removed when the dummy layer 183 is removed.

In the exemplary embodiments of the invention, the surface characteristic of the first electrode 170 underlying the dummy layer 183 can be improved by the etching process used to remove the dummy layer 183. In other words, the hole injection efficiency increases due to an increase in the work function, and thus the electrical characteristics of the organic light emitting device can be improved.

In the exemplary embodiments of the invention, the power line 182 is formed using the two conductive layers. More specifically, because the second conductive layer 181 corresponding to an upper layer of the power line 182 is formed using a material having the conductivity and the etch selectivity, the power line 182 can be prevented from being damaged when the dummy layer 183 is removed. Further, the image quality can be improved by supplying a constant voltage to the second electrode of the organic light emitting diode.

Although a top gate type thin film transistor is described as an example of a thin film transistor in the exemplary embodiments of the invention, a bottom gate type thin film transistor or other types of TFTs may be used.

It will be apparent to those skilled in the art that various modifications and variations can be made in the embodiments of the invention without departing from the spirit or scope of the invention. Thus, it is intended that embodiments of the invention cover the modifications and variations of this invention provided they come within the scope of the appended claims and their equivalents.

What is claimed is:

1. A method for fabricating an organic light emitting device, comprising:
    forming a mother substrate structure including a plurality of organic light emitting devices, each of the organic light emitting devices including a plurality of thin film transistors and a plurality of first electrodes, each of the first electrodes being electrically connected to the corresponding thin film transistor and being a part of an organic light emitting diode (OLED) to be formed;
    forming a first conductive layer on an insulating layer, and a second conductive layer on the first conductive layer, so as to form a power line in each of the organic light emitting devices;
    forming a dummy layer on the first electrodes and the second conductive layer;
    performing at least one of a scribing process and a grinding process on the mother substrate structure including the dummy layer so as to divide the mother substrate structure into a plurality of sub-substrate structures;
    removing the dummy layer from the first electrodes and the second conductive layer after the performing step; and forming a light emitting layer and a second electrode on the first electrode in at least one of the sub-substrate structures so as to form the OLED.

2. The method of claim 1, wherein the second conductive layer and the dummy layer have different etch selectivities.

3. The method of claim 1, wherein the first electrodes are formed at the same time that the second conductive layer is formed.

4. The method of claim 1, wherein the first electrodes are formed with the second conductive layer using a same material.

5. The method of claim 1, wherein each of the thin film transistors includes a source electrode and a drain electrode, and the source and drain electrodes are formed at the same time that the first conductive layer are formed using a same material.

6. The method of claim 1, wherein in the performing step, the scribing process is performed and the grinding process is performed after the scribing process is performed,
wherein the dummy layer is removed from the first electrodes and the second conductive layer after the scribing and grinding processes are performed.

7. The method of claim 1, wherein the dummy layer is composed of a metal material, a transparent conductive material, or an inorganic material.

8. The method of claim 1, wherein the dummy layer is composed of molybdenum (Mo), ITO, indium-zinc-oxide (IZO), ITZO, or silicon nitride.

9. The method of claim 1, wherein the first electrodes are formed at the same time that the second conductive layer is formed using a same material.

* * * * *